United States Patent
Li

(10) Patent No.: US 6,242,979 B1
(45) Date of Patent: Jun. 5, 2001

(54) LINEARIZATION USING PARALLEL CANCELLATION IN LINEAR POWER AMPLIFIER

(75) Inventor: Ping Li, Fox River Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/510,872

(22) Filed: Feb. 23, 2000

(51) Int. Cl.$^7$ ........................................... H03F 1/26
(52) U.S. Cl. ................... 330/149; 330/124 R; 375/297
(58) Field of Search ..................... 330/124 R, 149; 375/297

(56) References Cited

U.S. PATENT DOCUMENTS

| | | | |
|---|---|---|---|
| 4,701,716 | * | 10/1987 | Poole ........................................ 330/43 |
| 4,985,686 | * | 1/1991 | Davidson et al. ................ 330/124 R |
| 5,568,086 | * | 10/1996 | Schuss et al. .................... 330/124 R |
| 5,712,592 | * | 1/1998 | Stimson et al. .................. 330/124 R |
| 5,760,646 | * | 6/1998 | Belcher et al. ....................... 330/149 |

* cited by examiner

*Primary Examiner*—Robert Pascal
*Assistant Examiner*—Henry Choe
(74) *Attorney, Agent, or Firm*—Kenneth A. Haas

(57) ABSTRACT

A predistortion linear power amplifier and method employs parallel predistortion cancellation. In one embodiment the predistortion linear power amplifier (200) utilizes a signal splitter (202) to split an input carrier signal. A first amplifier, such as a main power amplifier (206) in a first path (214), receives the first split carrier signal (216). A signal predistortor (210) in a second path (218) is operatively coupled to receive a second split carrier signal (220) and to output a predistorted carrier signal (226). A second amplifier, such as a linear power amplifier (212) serially coupled with the signal predistortor (210) in the second path, amplifies the predistorted carrier signal (226). A signal combiner (208) operatively combines the output from the first amplifier and the output from the second amplifier to provide an amplified carrier output signal (230) from which nonlinear distortion has been substantially cancelled.

13 Claims, 5 Drawing Sheets

LINEARIZATION USING PARALLEL CANCELLATION IN LINEAR POWER AMPLIFIER

FIELD OF THE INVENTION

The invention relates generally to linear power amplifiers and more particularly to linear power amplifiers using signal predistortion for intermodulation distortion correction.

BACKGROUND OF THE INVENTION

Expandable linear power amplifier systems are often used in radio frequency communication systems, such as multi-carrier cellular systems or other wireless communication systems. Expandable linear power amplifier systems typically include a number of linear power amplifiers operating in parallel and output signals are combined, as known in the art, into a single high power signal before transmission.

Such linear power amplifiers may employ feedforward error correction circuits, such as dual loop feedforward error correction circuits. Accordingly, improved linearity may be achieved with such linear power amplifiers. In such a design, the main amplifiers of a linear power amplifier may be coupled to one, two or more feedforward error correction loops. The main amplifier circuit may include a plurality of power amplifiers that are operating in a parallel fashion. The main amplifier circuits are typically larger and draw more current than the associated feedforward loops. Although improved linearity may be provided by, for example, two feedforward loops coupled to a main amplifier circuit, each loop adds delay that need to be corrected using low loss delay lines in main path. Also the feedforward linear power amplifier technique uses a pilot signal to monitor the error cancellation loop, which forms a closed loop system control. Such feedforward linear power amplifiers typically have relatively complicated feedforward circuitry and require delay circuit and other gain and phase adjustments.

One example of the operation of a feedforward amplifier may be found, for example, in U.S. Pat. No. 5,831,479, having inventor Leffel et al., issued Nov. 3, 1998, owned by instant assignee and incorporated herein by reference.

Another technique to linearize main amplifier output includes the technique of predistortion. FIG. 1 illustrates a conventional predistortion linear power amplifier 100 that uses serial intermodulation distortion (IMD) cancellation. The predistortion linear power amplifier 100 includes a predistortor 102. A signal splitter 104, power amplifiers 106 and 108 and a combiner 110 form the main power amplifier. The power amplifiers 106 and 108 are identical. The predistortor 102 as known in the art is used to generate, for example, a third order intermodulation distortion signal which is used to cancel the intermodulation distortion generated by the main amplifier due to the nonlinearity. The predistortor 102 and the main power amplifier are coupled in series. The predistortor 102 introduces a gain loss for the carrier signal so more amplification stages are required to compensate for the loss. For example, the predistortor 102 generates, for example, intermodulation distortion which is 180° out of phase with the intermodulation distortion generated by the main amplifier. The intermodulation distortion is effectively added to the carrier signal and subsequently split into two paths by signal splitter 104. The power amplifiers 106 and 108 amplify the intermodulation distortion as well as the carrier signal. Due to the nonlinearity of the power amplifiers 106 and 108, the output signal from the main amplifier includes carrier signal, intermodulation distortion generated by the predistortor and the intermodulation distortion generated by the power amplifiers 106 and 108. Since the intermodulation distortion generated by predistortor has same magnitude but 180° out of phase compared to the distortion generated by the main amplifier. The total intermodulation distortion of the output signal is significantly reduced. The combiner 110 (e.g., quadrature coupler) then combines the split carrier signal. This arrangement is typically an open loop arrangement.

Consequently, there exists a need for a linear power amplifier that utilizes predistortion that does not attenuate a main carrier signal to such a degree as a conventional predistortion linear power amplifiers.

DETAILED DESCRIPTION OF THE PREFERRED EMBODIMENT

Briefly, a predistortion linear power amplifier and method employs parallel predistortion cancellation. In one embodiment the predistortion linear power amplifier utilizes a signal splitter to split an input carrier signal. A first amplifier, such as a main power amplifier in a first path, receives the first split carrier signal. A signal predistortor in a second path is operatively coupled to receive a second split carrier signal and to output a predistorted carrier signal. A second amplifier, such as a linear power amplifier serially coupled with the signal predistortor in the second path, amplifies the predistorted carrier signal. A signal combiner operatively combines the output from the first amplifier and the output from the second amplifier to provide an output signal from which nonlinear distortion has been substantially cancelled.

Figure 1:
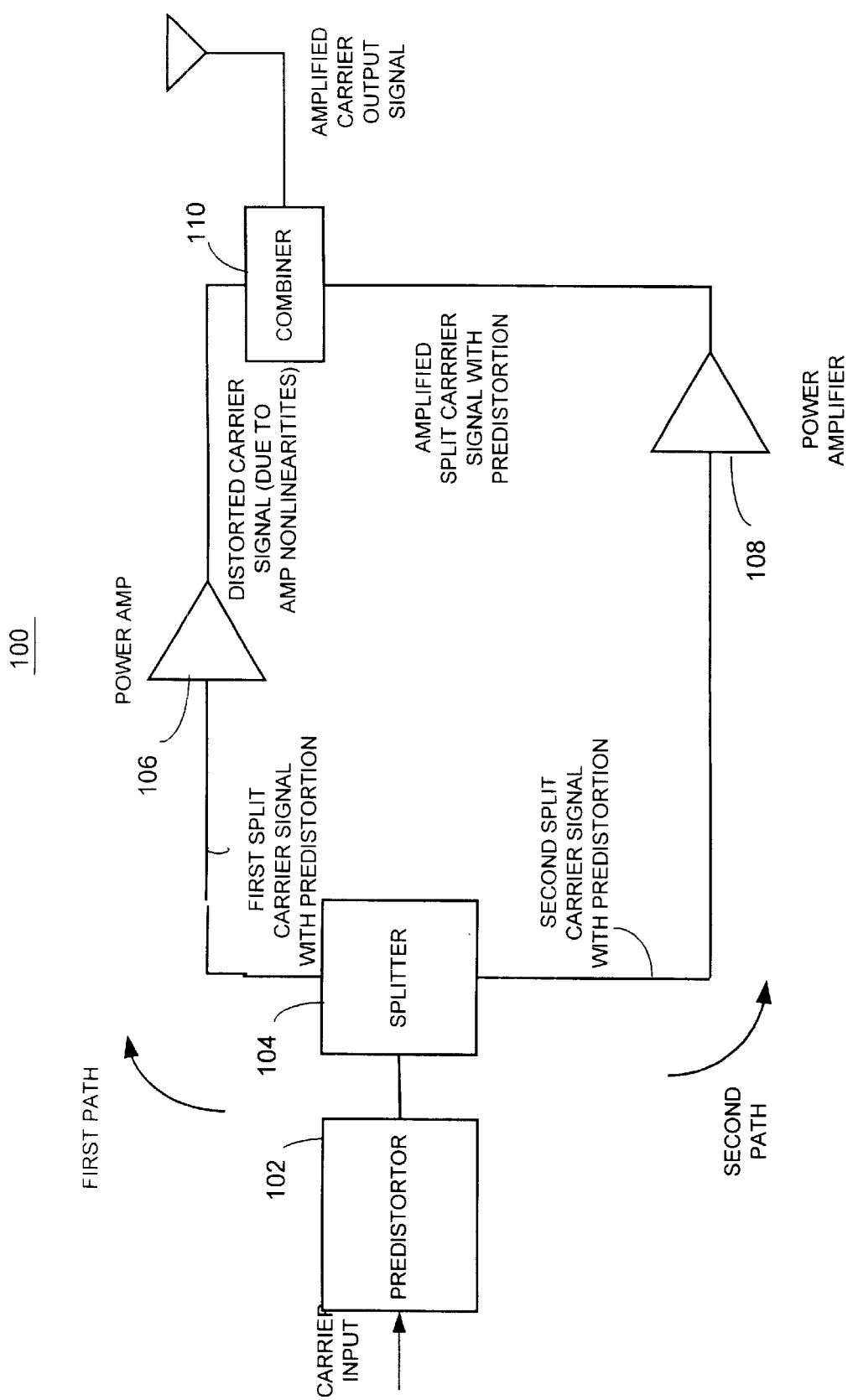
FIG. 1 is block diagram illustrating one example of a predistortion linear power amplifier using serial cancellation as known in the art.
Figure 2:
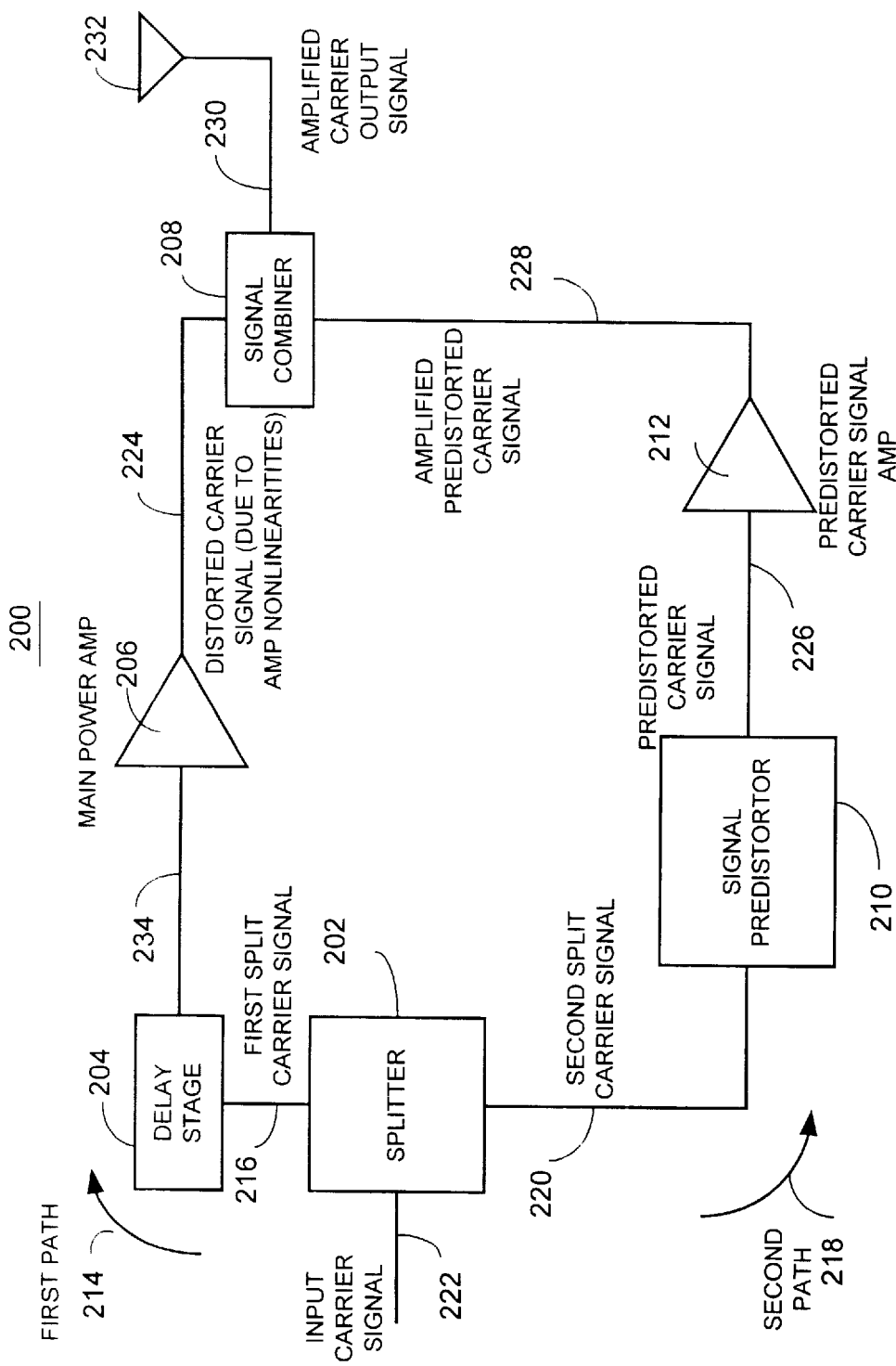
FIG. 2 is a block diagram illustrating one example of a linear power amplifier to amplifying an input carrier signal in accordance with one embodiment of the invention.

FIG. 2 illustrates one example of a linear power amplifier 200 that employs predistortion based parallel cancellation in accordance with the invention. The linear power amplifier 200 may be used in any suitable wireless transmitter or transmission system. For example, the linear power amplifier 200 may be used in a microwave frequency based wireless communication system, or any other suitable wireless system. The linear power amplifier includes a signal splitter 202, a delay stage 204, a main power amplifier 206, a signal combiner 208, a signal predistortor 210 and a linear amplifier, such as predistorted carrier signal amplifier 212. As shown, the delay stage 204 and the main power amplifier 206 are in a first path 214 that processes a first split carrier signal 216 output from signal splitter 202. The signal predistortor 210 and the predistorted carrier signal amplifier 212 are in a second path 218 which processes a second split carrier signal 220 that is output from signal splitter 202. The signal splitter 202 receives an input carrier signal 222 and suitably splits the input carrier signal 222 into the first split carrier signal 216 and into the second split carrier signal 220, as known in the art. The main power amplifier 206 is operatively coupled to receive the first split carrier signal 216 through delay stage 204. The main power amplifier 206 outputs a distorted carrier signal 224 that is distorted due to amplifier nonlinearities associated with the main power amplifier 206.

The main power amplifier 206 may be any suitable power amplifier configuration including, but not limited to, a plurality of parallel coupled power amplifiers, such as those found, for example, in a double density expandable linear power amplifier sold by Motorola Inc. Product No. SGTF1066 as may be found, for example, in a Motorola SC4840 or SC 2440 base station, or any other suitable power amplifier configuration.

The signal predistortor 210 is operatively coupled to receive the second split carrier signal 220. The signal predistortor 210 outputs a predistorted carrier signal 226 that includes distorted signals that are approximately 180° out of phase of with respect to the intermodulation distortion generated by the main power amplifier 206. By way of example, the predistorted carrier signal 226 may be a third order intermodulation signal or any other suitable order intermodulation distortion signal. As known in the art, the signal predistortor 210 generates the 180° out of phase intermodulation distortion signals based on a priori knowledge of the distortion characteristics of the main power amplifier 206. The signal predistortor 210 is designed such that there is a 180° phase shift between the intermodulation distortions generated by the predistortor 210 and by the main amplifier 206. The magnitude of the third order intermodulation distortion signals after the linear amplifier 212 matches the intermodulation distortion from the main power amplifier 206 in the first path 214 to provide cancellation of intermodulation signals.

The predistorted carrier signal amplifier 212 receives the predistorted carrier signal 226 which includes a split portion of the carrier input signal 222 along with, for example, third order intermodulation distortion signals that are 180° out of phase with the intermodulation distortion component generated by the main power amplifier 206. The predistorted carrier signal amplifier 212 amplifies the predistorted carrier signal 226 to provide amplified predistorted carrier signal 228, which is received by the signal combiner 208. The signal combiner 208 is operatively coupled to an output of the main power amplifier 206 to receive the distorted carrier signal 224, and is also operatively coupled to an output of the predistorted carrier signal amplifier 212 to receive the amplified predistorted carrier signal 228. The signal combiner 208 combines the distorted carrier signal 224 with the amplified predistorted carrier signal 228 to generate an amplified carrier output signal 230 which is transmitted via antenna 232.

The predistorted carrier signal amplifier 212 operates in a linear mode. The linear operation of 212 is guaranteed since the amplifier is biased as class AB and since the amplifier operates in the back-off mode (the amplifier operates at the output power level much lower than its rated power) due to the carrier signal loss from the signal predistortor 212. Therefore, the third order intermodulation component generated by the predistorted carrier signal amplifier 212 is insubstantial. Accordingly, the predistorted carrier signal amplifier 212 effectively provides little or no additional intermodulation distortion.

The signal combiner 208 combines the power from the main power amplifier 206 in the first path 214 such as a main path, with the predistorted carrier signal amplifier 212 power from the second path 218 (e.g., error path). Since the carrier signals from both the first path 214 and the second path 218 are in phase and since the third order intermodulation distortion from both paths are out of phase, the carrier signal will combine constructively and third order intermodulation distortion will cancel each other. Accordingly, linearity of the linear power amplifier 200 may be improved.

Figure 3:
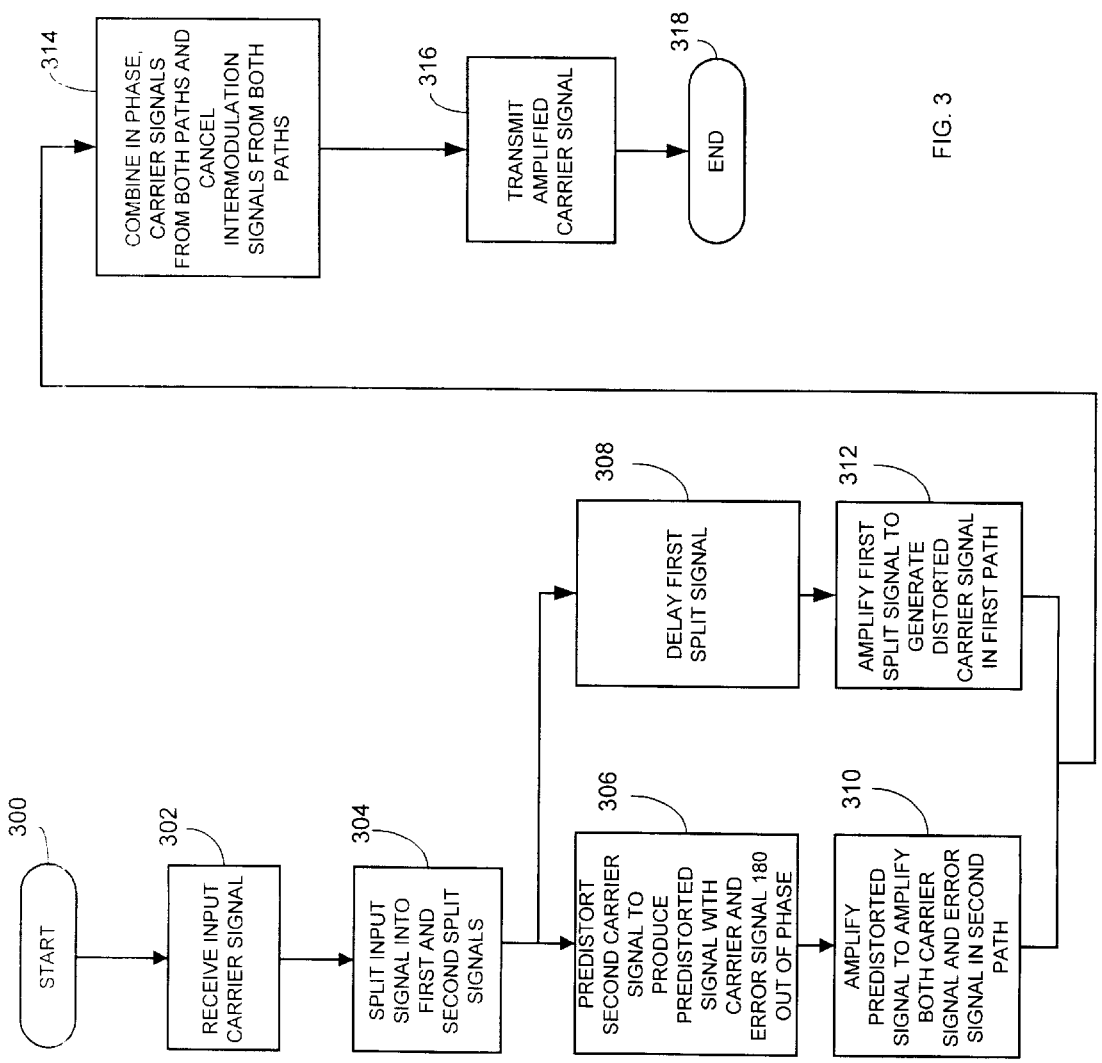
FIG. 3 is a flow chart illustrating one example of the operation of the linear power amplifier shown in FIG. 2.

FIG. 3 illustrates a flow chart setting forth one example of the operation of the linear power amplifier 200 shown in FIG. 2. As shown in block 200, the method includes initializing the linear power amplifier 200 by allowing the linear power amplifier 200 to settle prior to transmitting an amplified carrier output signal 230. As shown in block 302, the method includes receiving the input carrier signal 222. As shown in block 304, the process includes splitting the input carrier signal 222 into first and second split signals 216 and 220. As shown in block 306, the process includes predistorting the second split carrier signal 220 to produce a predistorted carrier signal 226 that includes a carrier signal with an IMD signal, such as an intermodulation signal that is 180° out of phase with intermodulation signals generated from the main power amplifier 206.

As shown in block 308, the process also includes delaying the first split carrier signal to provide a delayed first split carrier signal 234 to facilitate time alignment for the signal combiner 208. As shown in block 310, the process also includes amplifying the predistorted carrier signal 226 in the second path 218 to amplify both the carrier signal and the IMD signal. As shown in block 312, the process also includes amplifying the delayed first split carrier signal 234 to generate the distorted carrier signal 224 in the first path 214. As shown in block 314, the process also includes combining in phase, carrier signals from both the first path 214 and the second path 218 namely, the distorted carrier signal 224 with the IMD signal and amplified predistorted carrier signal 228, to cancel intermodulation signals from both paths. In addition, the process includes generating, from the second split carrier signal 220, the predistorted carrier signal 226. The process includes generating an amplified carrier signal component and an intermodulation component from the predistorted carrier signal 226 to form the amplified predistorted carrier signal 228. The process includes combining the amplified carrier signal component and the intermodulation component, with the distorted carrier signal containing the IMD signal (e.g., the distorted carrier signal 224) to remove the IMD signal to produce the amplified carrier output signal 230. The generation of a predistorted carrier signal includes generating a distorted carrier signal with intermodulation signals 180° out of phase with the intermodulation distortion signal generated by main power amplifier. As shown in block 316, the amplified carrier signal is then transmitted. As shown in block 318, the linear power amplifier 200 then waits to amplify an incoming carrier signal.

Figure 4:
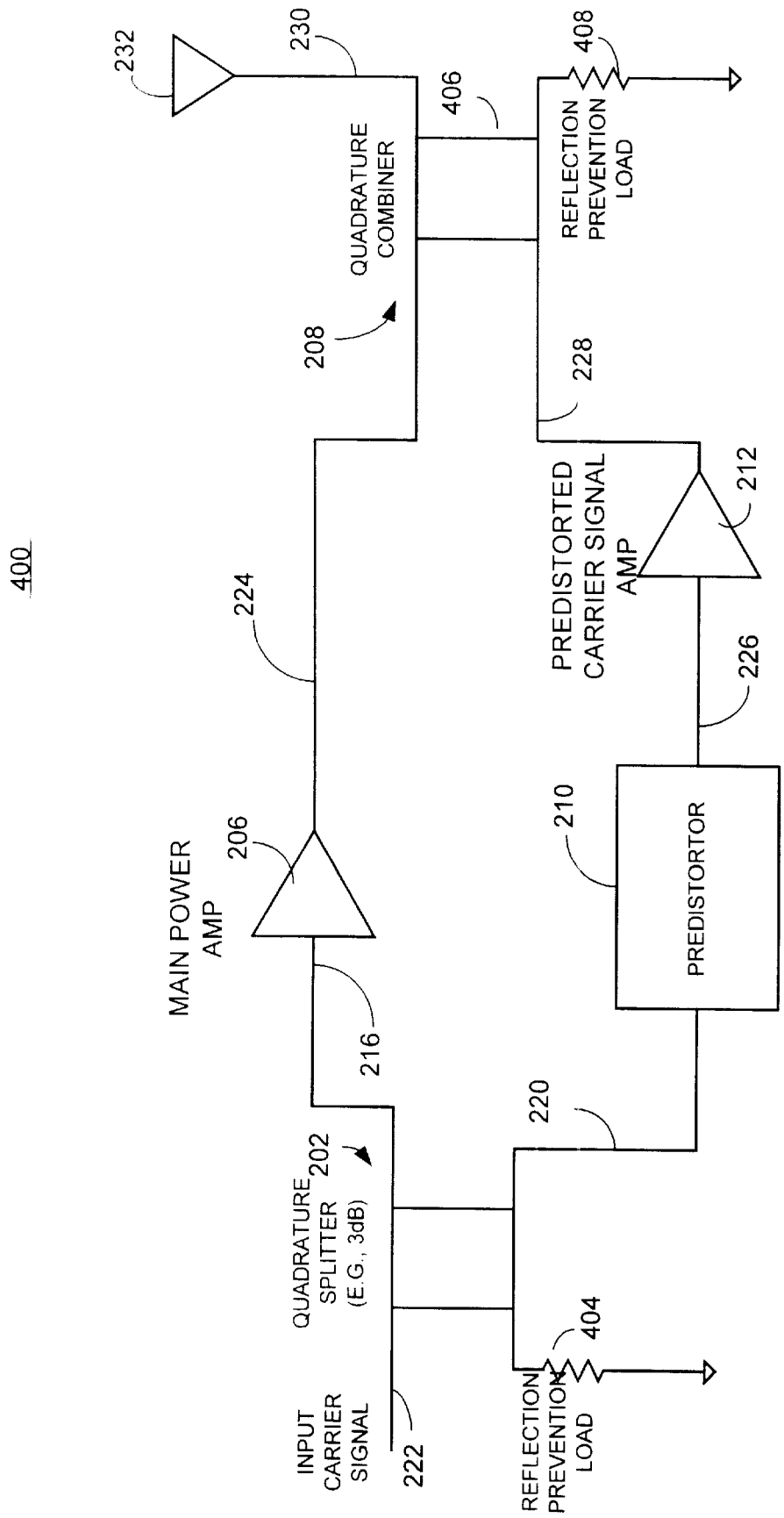
FIG. 4 is a more detailed block diagram of the linear power amplifier shown in FIG. 2.

FIG. 4 illustrates one example of the linear power amplifier 200, in the form of linear power amplifier 400 wherein the signal splitter 202 is a quadrature coupler such as a 3 dB quadrature coupler 402 and wherein the signal combiner 208 is a quadrature combiner 406. The quadrature coupler 402 is operatively coupled to a load 404 to prevent reflections if a portion of the predistortor 210 fails. Any suitable load may be used as known in the art. For example, the load 404 may be a 50 Ohm resistive load. The quadrature coupler 402 may have a operation frequency of 1.9 gigahertz, or any other suitable frequency. The quadrature combiner 406 may also have a operation frequency of 1.9 gigahertz, or any other suitable cutoff frequency. The load 408 may be any suitable type of load, for example, a 50 ohm resistive load or any other suitable load.

Figure 5:
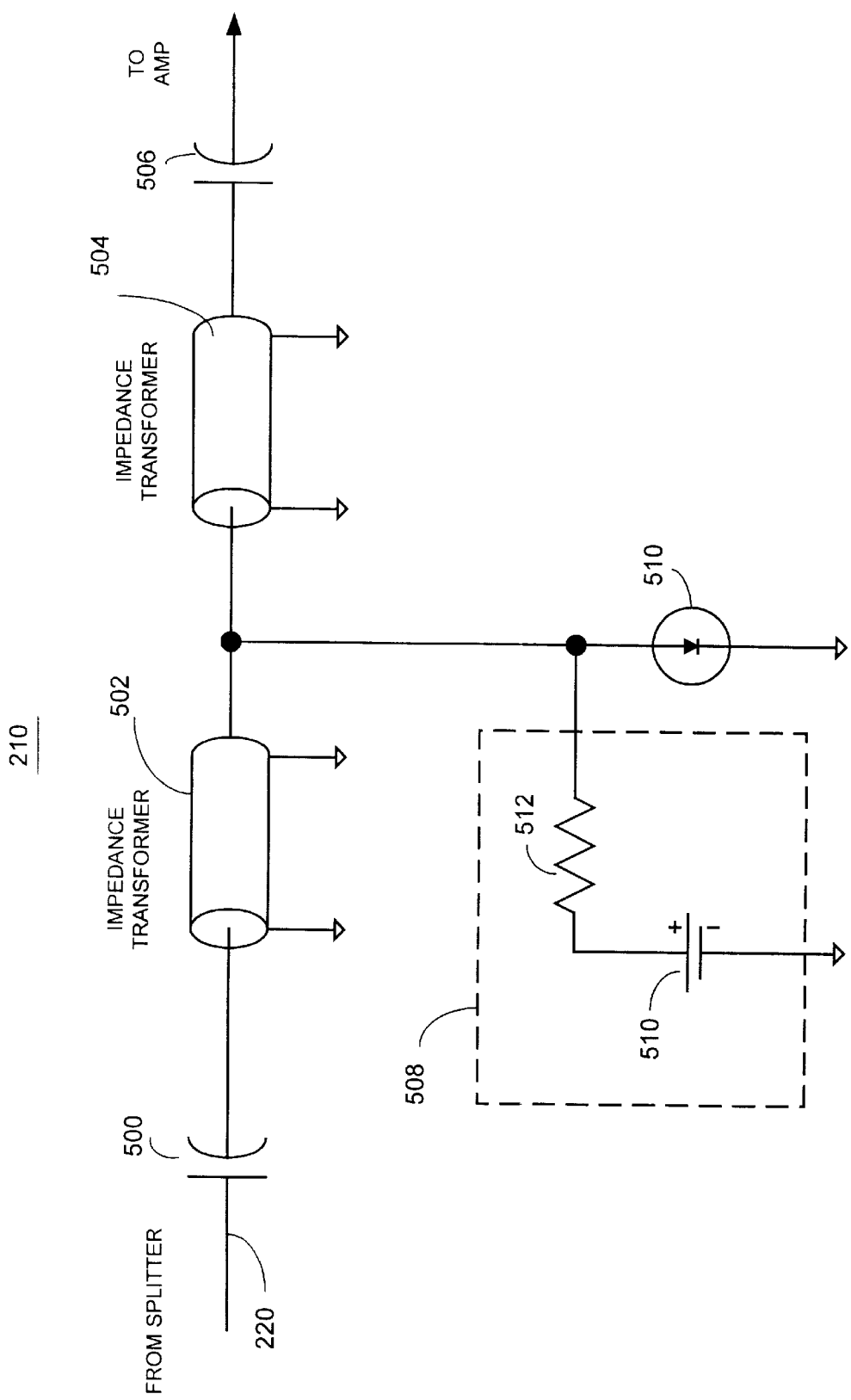
FIG. 5 is a circuit diagram illustrating one example of a predistortor in accordance with one embodiment of the invention.

FIG. 5 is a circuit diagram illustrating one example of signal predistortor 210. Signal predistortor 210 may include, for example, an input capacitor 500, a first impedance transformer 502, a second impedance transformer 504, an output capacitor 506, a predistortor biasing circuit 508 and a nonlinear component 510. The input capacitor 500 serves as a direct current (DC) blocking capacitor. Similarly, output capacitor 506 serves as a second DC blocking capacitor. These capacitors may be any suitable size, for example, 100 picofarads. The impedance transformers 502 and 504 have terminals that are operatively coupled to each other and are also operatively coupled to the nonlinear component 510, such as a diode, and to the predistortor biasing circuit 508. The predistortor biasing circuit 508 may include a power source 510 operatively coupled in series with a resistive element 512. The signal predistortor 210 may be any conventional signal predistortor as known in the art. In this embodiment, the impedance transformers 502 and 504 have approximately a 16 ohm impedance and a operation frequency of 1.9 gigahertz; however, any suitable impedance transformer may be used.

In addition, the linear power amplifier 200 may be incorporated in a wireless base station system, such as a cellular phone base station. In such a wireless base station system, a transmitter may include a plurality of the linear power amplifiers 200. Accordingly, a plurality of linear power amplifiers 200 may be operatively coupled to each receive a different input carrier signal and provide a separate amplified carrier output signal. Accordingly, the wireless base station system may include a transmitter that includes a first linear power amplifier operative to amplify a first input carrier signal, wherein the first linear power amplifier is configured with the signal splitter, main power amplifier, signal predistortor, predistorted carrier signal amplifier and signal combiner, described with reference to FIG. 2. In addition, the transmitter may include a second (or more) linear power amplifier operative to amplify a second carrier input signal using a second linear power amplifier configured as described with reference to FIG. 2.

Compared with conventional feedforward power amplifiers, the disclosed linear power amplifier simplifies the circuit design for intermodulation signal cancellation. For example, a feedforward power amplifier carrier cancellation circuit is eliminated. In addition, the second path 218 (error path) includes carrier power amplification, hence the linear power amplifier provides higher power capability compared with feedforward power amplifiers where the error path is only for error signal amplification and there is no contribution to the carrier power amplification. Furthermore, high power delay circuit is also eliminated, which results in lower power loss and lower cost. In addition, compared with conventional predistortion power amplifiers using series cancellation, the disclosed linear power amplifier provides high power gain. In addition, the IMD signal is separated from the main carrier signal so that the magnitude and phase of the intermodulation signals can be adjusted without significantly affecting the carrier signal. Other advantages will also be apparent to those of ordinary skill in the art.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A linear power amplifier for amplifying an input carrier signal comprising:
    a signal splitter operatively coupled to split the input carrier signal into at least a first split carrier signal and a second split carrier signal;
    a delay stage having the first split carrier signal as an input and outputting a delayed first split carrier signal;
    a first amplifier in a first path, having the delayed first split carrier signal as an input;
    a signal predistortor in a second path, operatively coupled to receive the second split carrier signal and to output a predistorted carrier signal, wherein the signal predistortor generates a distorted carrier signal with intermodulation signals 180 degrees out of phase with the intermodulation distortion in the output signal from a main power amplifier;
    a second amplifier in the second path and operatively responsive to the predistorted carrier signal; and
    a signal combiner, operatively coupled to an output from the first amplifier and to an output of The second amplifier.

2. The amplifier of claim 1 wherein the signal splitter is a quadrature coupler.

3. The amplifier of claim 1 wherein the signal combiner is a quadrature coupler.

4. The amplifier of claim 1 wherein the first amplifier is a main power amplifier operating in saturated mode and wherein the second amplifier operates in a linear mode.

5. The amplifier of claim 1 wherein the second amplifier amplifies the predistorted carrier signal which includes both the carrier signal and intermodulation signals.

6. A wireless base station system comprising:
    a transmitter that includes:
        at least a first linear power amplifier operative to amplify a first input carrier signal and including:
            a first signal splitter operatively coupled to split the first input carrier signal into at least a first split carrier signal and a second split carrier signal;
            a delay stage having the first split carrier signal as an input and outputting a delayed first split carrier signal;
            a first amplifier in a first path, having the delayed first split carrier signal as an input;
            a first signal predistortor in a second path, operatively coupled to receive the second split carrier signal and to output a predistorted carrier signal;
            a second amplifier in the second path and operatively responsive to The predistorted carrier signal; and
            a first signal combiner, operatively coupled to an output from the first amplifier and to an output of the second amplifier; and
        at least a second linear power amplifier operative to amplify a second input carrier signal and including:
            a second signal splitter operatively coupled to split the second input carrier signal into at least a third split carrier signal carrier fourth split carrier signal;
            a third amplifier in a third path, operatively coupled to receive the third split carrier signal;
            a second signal predistortor in a fourth path, operatively coupled to receive the fourth split carrier signal and to output a predistorted carrier signal;
            a fourth amplifier in the fourth path and operatively responsive to the predistorted carrier signal; and
            a second signal combiner, operatively coupled to an output from the third amplifier and to an output of the fourth amplifier.

7. The amplifier of claim 6 wherein the first and second signal splitters are quadrature splitters.

8. The amplifier of claim 6 wherein the first and second signal combiners are quadrature combiners.

9. The amplifier of claim 6 wherein the first and third amplifiers are main power amplifiers and wherein the second and fourth amplifiers operate in a linear mode.

10. The amplifier of claim 6 wherein the first and second signal predistortors each generate a distorted carrier signal with at least intermodulation signals 180 degrees out of phase with respect to first and second input carrier signals.

11. The amplifier of claim 6 wherein the second and fourth amplifiers amplify respective predistorted carrier signals, each including both a respective carrier signal and respective intermodulation signals.

12. A method for providing linear amplification comprising the steps of:

splitting an input carrier signal into at least a first split carrier signal for a first path and a second split carrier signal for a second path;

delaying the first split carrier signal by a predetermined amount;

generating, from the delayed first split carrier signal, a distorted carrier signal containing an error signal;

generating, from the second split carrier signal, a predistorted carrier signal, wherein the step of generating the predistorted carrier signal includes the step of generating a distorted carrier signal with intermodulation signals 180 degrees out of phase, with the error signal in the distorted carrier signal;

amplifying the predistorted carrier signal to produce an amplified predistorted carrier signal; and combining the amplified predistorted carrier signal with the distorted carrier signal containing the error signal, to remove the error signal to produce an amplified carrier output signal.

13. The method of claim 12 including the step of delaying the first split carrier signal in the first path.

* * * * *

UNITED STATES PATENT AND TRADEMARK OFFICE
CERTIFICATE OF CORRECTION

PATENT NO. : 6,242,979 B1
DATED : June 5, 2001
INVENTOR(S) : Li

It is certified that error appears in the above-identified patent and that said Letters Patent is hereby corrected as shown below:

<u>Column 6,</u>
Line 58, after second "carrier" and before "fourth", insert --and a --.

Signed and Sealed this

Fourth Day of December, 2001

Attest:

*Attesting Officer*

NICHOLAS P. GODICI
*Acting Director of the United States Patent and Trademark Office*